United States Patent [19]

Mitter

[11] 4,263,558
[45] Apr. 21, 1981

[54] PHASE-SELECTIVE AMPLIFIER

[75] Inventor: Norbert Mitter, Bad Schwartau, Fed. Rep. of Germany

[73] Assignee: Drägerwerk Aktiengesellschaft, Fed. Rep. of Germany

[21] Appl. No.: 51,149

[22] Filed: Jun. 22, 1979

[30] Foreign Application Priority Data

Jul. 27, 1978 [DE] Fed. Rep. of Germany ....... 2832920

[51] Int. Cl.³ .............................................. H03F 3/38
[52] U.S. Cl. ..................................... 330/10; 324/118
[58] Field of Search ......................... 330/10; 328/165; 324/85, 118

[56] References Cited

U.S. PATENT DOCUMENTS 3,416,087  12/1968  Vargiu ............................. 328/165 X Primary Examiner—James B. Mullins
Attorney, Agent, or Firm—John J. McGlew

[57] ABSTRACT

A phase-selective amplifier includes a first mixer with amplification switches to switch the amplification of the first mixer to n/2 conditions having approximately a sinusoidal relation. A second mixer receives the output of the first mixer, and an amplification switch is provided to switch the amplification of the mixer between a positive and a negative value. A voltage-controlled oscillator is provided with a phase control circuit, and logic elements are provided to connect the amplification switches to the phase control circuit.

5 Claims, 2 Drawing Figures

FIG. I

PHASE-SELECTIVE AMPLIFIER

BACKGROUND OF THE INVENTION

Phase-selection amplifiers are well suited for measuring weak signals in the presence of a high noise level. By mixing the signals to be measured with a reference voltage having the same frequency, mixture products are obtained that have a d.c. value only for the signal to be measured. This d.c. signal can therefore be easily filtered and further processed, while the signals having interfering frequencies have no d.c. component and therefore drop out. The signal to be measured is frequently a carrier that is amplitude-modulated with a low frequency signal. The modulation side bands formed must be processed by the phase-selective amplifier in spite of the high selectivity of the amplifier.

It is known to use a phase-selective amplifier, also referred to as a lock-in amplifier, for measuring weak signals, which may be referred to as desired signals, in the presence of a high noise level. After preamplification and filtering, the desired signal is supplied to one input terminal of a synchronous detector operating as a mixer stage. The second input terminal of the mixer stage is supplied with a rectangular-wave reference signal having a frequency corresponding to the known frequency of the desired signal to be measured. To equalize the phase, an adjustable phase shifter is provided in the reference channel. If the two input signals are in synchronism, alternate half-waves of the desired signal are inverted by the switching effect of the mixer stage, in step with the fixed cycle of the reference voltage. The inverted half-waves, along with the non-inverted half-waves, produce a d.c. signal component at the output of the mixer stage. This d.c. signal is further processed through low-pass filters and d.c. voltage amplifiers. Interfering frequencies, in general, are not synchronous with the reference signal and, therefore, produce no d.c. signal at the output of the mixer stage. An exception is a harmonic, particularly an odd harmonic, of the desired signal. Because of the rectangular shape of the reference voltage, which is equivalent to the summation of the fundamental wave with its odd harmonics, d.c. signals also appear at the output of the mixer stage due to these harmonics, which can be attenuated only by expensive filtering of the signal in advance of the mixer stage, narrowing the effective bandwidth (Electronic Design 21, Oct. 11, 1974, Vol. 22, pages 104–109).

The use of synchronous detectors in receivers for signals having a definite frequency are well known. The desired signal voltage is usually amplified and heterodyned to an intermediate frequency, and this i.f. signal is then applied to the input of a synchronous detector. An oscillator is synchronized, both as to frequency and phase, by a control voltage produced by comparing the output a.c. voltage of the oscillator with the signal a.c. voltage in a phase discriminator. The output voltage from the discriminator is used to control the oscillator to lock in on the received signal voltage in a fixed phase relation as long as the original frequency of the oscillator does not differ by more than a certain amount from the signal frequency. The range of frequencies within which this effect is produced is the so-called lock-in range.

The synchronized a.c. voltage of the oscillator is supplied to the reference input terminal of the synchronous detector, and a d.c. signal can appear at the output of the synchronous detector only if the received signal and the reference signal voltages applied to the inputs are substantially in phase. This condition is satisfied only by signal frequencies within the lock-in range of the oscillator and capable of synchronizing it. Consequently, the filtering effect of the arrangement is determined by the lock-in range of the oscillator. The synchronous detector is connected to a switch which, in turn, is controlled by the output signals of the detector. This switch causes a d.c. output of the signal receiver to be switched to high or low resistance to furnish the information as to whether or not the signal being received, is within the lock-in range of the oscillator.

The use of this prior art signal receiver is limited to signal levels sufficient for synchronizing the oscillator. Very weak signals accompanied by a higher noise level cannot be detected by supplying a predetermined reference voltage. Because of the lock-in range of the oscillator, the signal receiver is fixed to a predetermined frequency, and no provision is made for variable tuning to allow different frequencies to be received. (German AS No. 25 27 578).

Another prior art circuit for preventing the harmonics in the reference signal from affecting the output voltage of a phase-selective amplifier also comprises an a.c. signal voltage amplifier followed by a phase-selective rectifier which is controlled by a reference signal. The phase of the reference signal relative to that of the measured signal is known in advance, and the circuit produces a d.c. signal by utilizing the reference signal in an additional phase-selective rectifier. The two phase-selective rectifiers are controlled, either in phase or exactly in phase opposition or with the same phase shift by which the measured signal and the reference signal are out of phase. The d.c. output of the additional rectifier controls the multiplication factor of a multiplier which is connected in the negative-feedback circuit of the a.c. signal amplifier and determines the gain of the latter amplifier. As a result, the effect of the harmonics in the reference signal causes the feedback factor of the a.c. signal, given by the multiplication factor, to be controlled in proportion to the variation of the proportional control factor of the rectifier for the measured voltage. Therefore, with a satisfactorily linear gain of the a.c. signal amplifier, these two errors compensate each other. The phase-selective rectifier for the measured voltage is followed by another d.c. amplifier. This prior art circuit allows the phase-selective rectifier for the measured voltage to operate unaffected, in a conventional manner. The effect of the harmonics contained in the measured signal or of the corresponding interfering frequencies cannot be reduced (German AS No. 18 06 314).

OBJECTS AND SUMMARY OF THE INVENTION

One of the objects of the present invention is to provide a phase-selective amplifier which is highly selective relative to the usual interfering frequencies and to harmonics contained in the signal to be measured as well as to interfering signals having the same frequency.

A further object is to make such an amplifier which is inexpensive to construct and is capable of handling satisfactory bandwidths.

A still further object is to provide a phase-selective amplifier in which it is possible in a simple way to adjust the phase of the reference voltage precisely relative to the switching signal for the first mixer stage, and to measure the harmonics contained in the signal to be measured.

The amplification of the first mixer stage which, in accordance with the invention, is connected to amplify in approximately sinusoidally stepped-off switching positions, varies approximately sinusoidally and, therefore, in practice, has a negligible harmonic content. With eight steps within a half-wave period, errors occurring due to frequencies in the range of harmonics do not disturb the result of measurement. This makes it possible to omit expensive filtering of the signal to be measured in advance of the first mixer stage; the transmitted bandwidth will not be reduced as it would be with a narrow-band filter.

In contradistinction to a theoretically pure sinusoidal variation of the gain, the connection to vary the amplification in approximately sinusoidal steps can be embodied in simple means, in a reproducible and reliable manner. By providing phase switches in the phase control circuit of a voltage-controlled oscillator, it is simple to adjust the phase of the reference voltage in satisfactorily accurate steps relative to the switching signal for the first mixer stage, which signal is obtained from the switching voltage at the output of the voltage-controlled oscillator. If the number n of steps is chosen to be equal to 8, this stepping approximates a continuous adjustment of the phase so closely that the possible deviation is only 2%. Connecting a frequency divider, which divides by m, and a second decoder and a second phase switch in the phase control circuit makes it possible to measure the nth harmonic contained in the desired signal in a very simple manner. The result of the inexpensive construction in all stages is a highly efficient and low-priced amplifier.

DETAILED DESCRIPTION OF THE PREFERRED EMBODIMENTS

Figure 1:
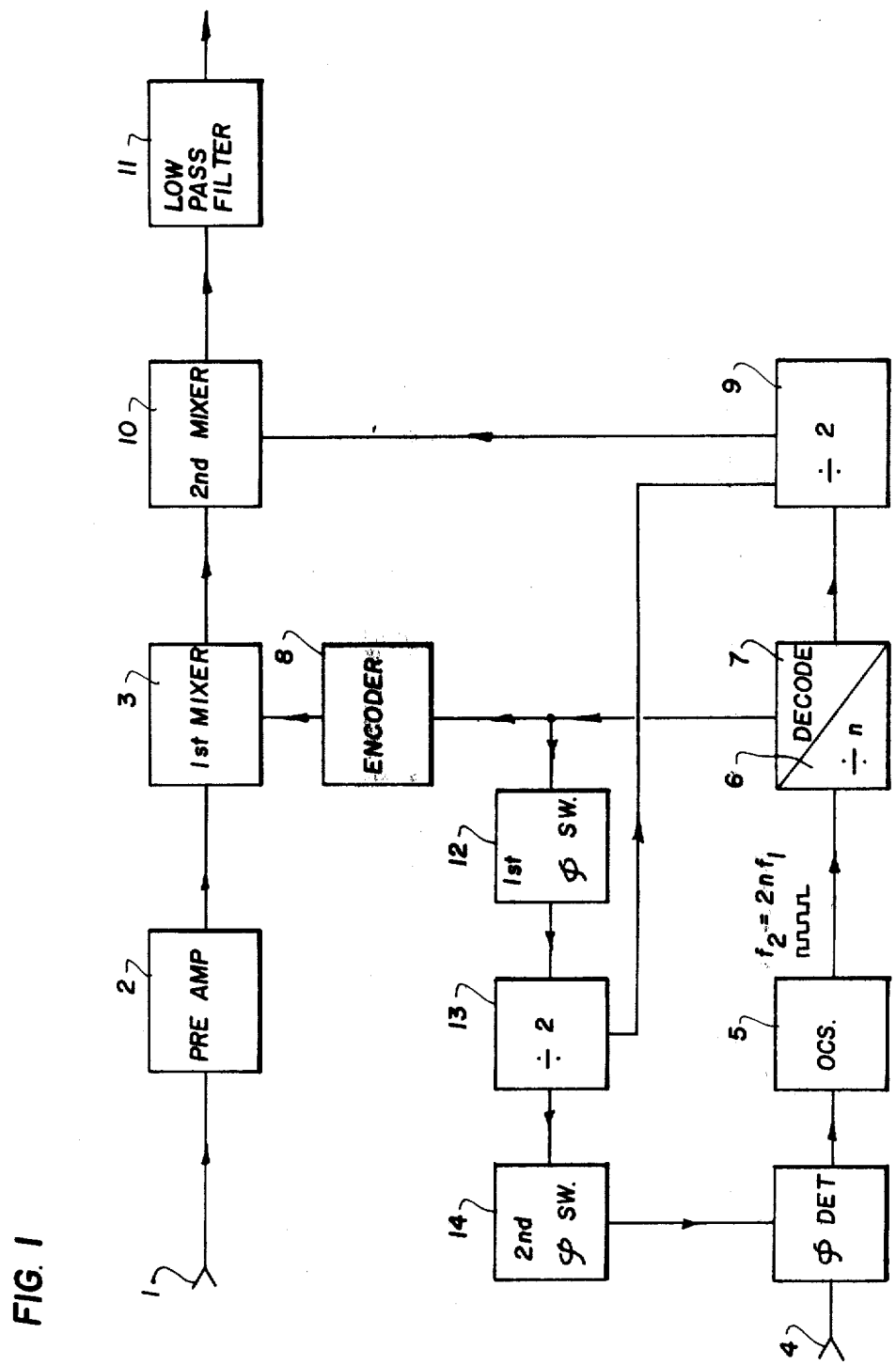
FIG. 1 is a block diagram of a phase-selective amplifier according to the present invention.

In the phase-selective amplifier of FIG. 1, a signal having a frequency $f_1$ is supplied to an input terminal 1, slightly filtered by attenuating high frequencies, amplified in a preamplifier 2, and supplied to a first mixer stage 3. A reference voltage of equal frequency $f_1$ is supplied to a reference input 4, which is connected to an oscillator 5. The oscillator generates a rectangular-wave switching voltage having a frequency $f_2$ which is 2n times the reference frequency $f_1$; that is $f_2 = 2n \times f_1$. A good choice is to set the value n=8, which makes $f_2 = 16f_1$.

The signal from the oscillator 5 is applied to a frequency divider 6 that divides the frequency $f_2$ by n and passes the divided signal to a decoder 7. The output of the decoder is applied to an encoder 8 to produce the switching voltage used for timing the signal that switches the amplification of the first mixer stage 3 in n/2 predetermined, fixed switching steps. In this operation, a half wave of the signal is amplified, increasingly and decreasingly, in n steps in such a way that the amplification approximates a sine function, with pairs of the n steps being symmetrical and equal to each other. For each step, fixed precision resistance determining the amplification (the values zero and infinity are also possible) is connected, through a respective amplification switch controlled by the switching signal, to the second input of the first mixer stage 3.

If a is the largest amplification of the first mixer stage 3, each kth step, determined by the respective resistance, is multiplied by the modulus of the sine function at the midpoint of each of these increments of time, thus:

$$a |\sin(wt + \phi_k)|,$$

wherein $$\phi_K = \frac{\pi}{n}(K - \tfrac{1}{2})$$

and k=1 ... 2n. To control the amplification switches, the frequency $f_2$ of the switching voltage is divided, in the frequency divider 6, by n, for example n=8, and continually counted from 1 to n. In the first decoder 7, the binary intermediate result appearing at three outputs is converted in the form "1 from n" to a natural number represented as a switching signal at n (for example 8) outputs. In the following encoder 8, the number of channels is reduced in the ratio n:n/2, that is the channels are distributed to the amplification switches provided there, and the correct association of the channels with the amplification switches is obtained by logic operations.

In the second mixer stage 10 that follows the first mixer 3, an amplification is effected with the sign of the synchronous reference frequency, thus b.sign[sin(wt + $\phi_k$)] (the largest amplification being designated b). For this purpose, the intermediate results of dividing by n in the divider 6 is further reduced, by the first decoder 7, in a frequency divider 9 that divides by 2, to the frequency $f_1$ of the signal or the reference frequency, for switching the respective amplification of second mixer stage 10, through the amplification switch, positively or negatively, to the full amount. The output signal obtained in this way is filtered, in the usual manner, in a low-pass filter and displayed.

The oscillator 5 is a voltage-controlled oscillator which is operated within a phase-contol circuit. The switching voltage obtained at the output of the oscillator 5 and having the frequency $f_2 = 2n \times f_1$, is fed back through the divider 6, the decoder 7, a first phase switch 12, another divider 13 that divides by 2, a phase switch 14, and a phase detector 15. If the controlled signals reaching the phase detector 15 from the second phase switch 14 and from reference input 4 are identical, the phase detector 15 delivers an average control voltage that keeps the oscillator 5 at the desired frequency $f_2$. With deviations, the control voltage varies in such a manner that the desired frequency $f_2$ of the oscillator 5 is restored. Because of the reduction by 2n effected in the feedback by dividers 6 and 13, the frequencies at the inputs of phase detector 15 are equal to each other if oscillator 5 delivers the frequency $f_2 = 2n \times f_1$. The phases at the inputs of phase detector 15 are equal to each other if the phase of the signal from the oscillator 5 at the frequency $f_2$ is out of phase relative to the reference signal at the frequency $f_1$ to such an extent that this shift in the feedback is just compensated by phase switches 12 and 14.

To adjust the phase shift, the first phase switch 12 establishes connection to one of the outputs of the first decoder 7 which, in relation to $f_1$, are time-shifted relative to each other, by $2\pi/2n$. In consequence, one switching step of the first phase switch 12 amounts to $\Delta\phi = \pi/n$. Since each output of the first decoder 7 supplies a voltage once in each half-wave of the signal having the frequency $f_1$, the second phase switch 14 is provided to determine the association with the first or second half-wave and, therefore, with the possible swtiching steps 0 and $\pi$. Between these phase switches 12 and 14, the divider 13 is inserted to effect the final reduction to the frequency $f_1$. A connection is provided between the divider 9 and the divider 13, to effect, for example, when switching on, a synchronization to the same haf-wave of $f_1$, while within this half-wave, the two dividers operate with their phases displaced by the amount adjusted in the first phase switch 12.

The phase-selective amplifier according to FIG. 1 may, of course, be operated also without supplying an outer reference frequency to the reference input 4. Instead, signal having the frequency $f_1$ available at the output of the second phase switch 14 may be brought out and supplied for timing the device producing the signal, whereby the frequencies $f_1$ at the signal input 1 and in the phase control circuit are equalized.

Figure 2:
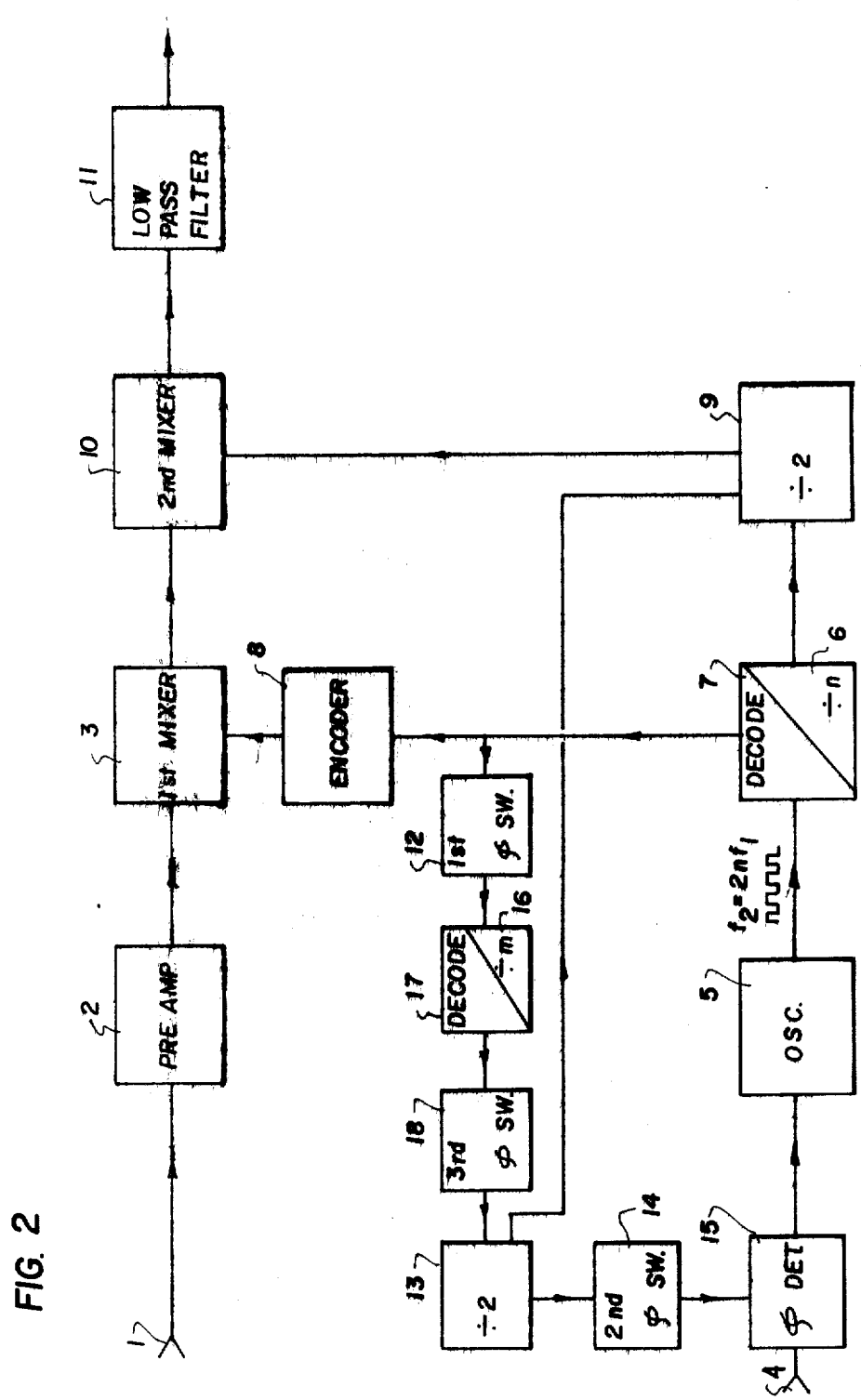
FIG. 2 is a similar illustration of another embodiment of a phase-selective amplifier adapted to permit measurement of the nth harmonic.

The phase-selective amplifier according to FIG. 2 is suitable for measuring the mth harmonic contained in the signal. To this end, in contradistinction to FIG. 1, an additional divider 16 that divides by m and a second decoder 1-from-m, and a third phase switch 18 having a switching step of $$\Delta\phi = \pi/m$$

are inserted in the pase control circuit after the first phase switch 12. The frequency $f_2$ of the switching voltage delivered by oscillator 5 is thereby increased to $f_2 = 2n \times m \times f_1$, so that an output signal for the mth harmonic is formed in the mixer stages.

What is claimed is:

1. A phase-selective amplifier comprising: a first mixer stage, the amplification of which can be switched; amplification switches connected to said first mixer stage to switch the amplification thereof to n/2 switching conditions corresponding to an approximately sinusoidal relationship; a second mixer stage connected to receive signals from the first mixer stage, the amplification of the second mixer stage also being capable of being switched; a second amplification switch to switch said amplification of said second mixer stage to two equal values, one positive and the other negative; a voltage-controlled oscillator; a phase control circuit connected to said oscillator; and logic elements connecting said amplification switches of said mixer stages to said phase control circuit.

2. The invention, as defined in claim 1, in which one of said logic elements is an encoder connected to said first mixer; and said phase control circuit comprises a first decoder connected to said encoder, said voltage controlled oscillator connected to said first decoder, a phase detector connected to said voltage controlled oscillator, a first frequency divider to divide by n connected to said first decoder, a first phase switch connected to said first decoder, a second frequency divider to divide by 2 connected to said first decoder, and a second phase switch connected to said phase detector to supply signals thereto and to said first phase switch; said first decoder being connected in the phase control circuit of said voltage controlled oscillator; and said first detector comprising a reference signal input to receive a reference signal to be compared with the input signal of said second phase switch.

3. The invention, as defined in claim 2, comprising a third frequency divider to divide by 2 connected to said first and second phase switches; said amplification switch of said second mixer stage being connected through said third frequency divider to said first decoder and to said second frequency divider.

4. The invention as defined in any one of claims 2, or 3 in which the frequency division ratio n of said first frequency divider is 8.

5. The invention, as defined in claim 4, comprising a fourth divider to divide by m; a second decoder connected to said fourth divider; and a third phase switch connected to said second decoder; said fourth frequency divider, said second decoder, and said third phase switch being connected in the phase control circuit between said first phase switch and said third frequency divider.

* * * * *